(12) United States Patent
Takahashi et al.

(10) Patent No.: US 12,114,429 B2
(45) Date of Patent: Oct. 8, 2024

(54) FLEXIBLE PRINTED CIRCUIT BOARD INCLUDING TERMINAL, WIRING MODULE, AND POWER STORAGE MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP); SUMITOMO ELECTRIC PRINTED CIRCUITS, INC., Shiga (JP)

(72) Inventors: Hideo Takahashi, Mie (JP); Shinichi Takase, Mie (JP); Hiroki Shimoda, Mie (JP); Tsutomu Kitajima, Shiga (JP); Yoshiro Adachi, Shiga (JP); Yuuki Oohashi, Shiga (JP); Manabu Sudou, Shiga (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 163 days.

(21) Appl. No.: 17/770,396

(22) PCT Filed: Sep. 7, 2020

(86) PCT No.: PCT/JP2020/033710
§ 371 (c)(1),
(2) Date: Apr. 20, 2022

(87) PCT Pub. No.: WO2021/084914
PCT Pub. Date: May 6, 2021

(65) Prior Publication Data
US 2022/0394856 A1    Dec. 8, 2022

(30) Foreign Application Priority Data
Oct. 31, 2019 (JP) .................. 2019-198339

(51) Int. Cl.
*H05K 1/18* (2006.01)
*H05K 1/11* (2006.01)

(52) U.S. Cl.
CPC ............. *H05K 1/189* (2013.01); *H05K 1/115* (2013.01); *H05K 2201/09281* (2013.01); *H05K 2201/09427* (2013.01); *H05K 2201/09854* (2013.01)

(58) Field of Classification Search
CPC ........ H05K 1/189; H05K 1/115; H05K 1/118; H05K 1/18; H05K 1/02; H05K 1/111;
(Continued)

(56) References Cited

U.S. PATENT DOCUMENTS 9,024,572 B2    5/2015    Nishihara et al.
2002/0038723 A1*    4/2002    Takeda ................ H05K 3/3405
174/557

(Continued)

FOREIGN PATENT DOCUMENTS

JP    S61-284991 A    12/1986
JP    2004-304019 A    10/2004
(Continued)

OTHER PUBLICATIONS

International Search Report issued in International Patent Application No. PCT/JP2020/033710, dated Nov. 24, 2020, English translation.
(Continued)

*Primary Examiner* — Roshn K Varghese
(74) *Attorney, Agent, or Firm* — GREENBLUM & BERNSTEIN, P.L.C.

(57) ABSTRACT

A flexible printed circuit board including a terminal includes a flexible printed circuit board that includes an electrically conductive line and the terminal soldered to the flexible printed circuit board. The flexible printed circuit board includes a land and a soldering restricting section. The land is electrically connected to the electrically conductive line and has a metal surface and is soldered to the terminal. The soldering restricting section has a non-metal surface and is not soldered to the terminal. The terminal includes an
(Continued)

overlapping section and a protrusion section. The overlapping section overlaps the land and is soldered to the land and includes a removed section that is formed in such a manner that a portion is partially removed in a predefined area. The protruding section is continuous from the overlapping section and protrudes to an area that does not overlap the flexible printed circuit board.

7 Claims, 14 Drawing Sheets

(58) Field of Classification Search
CPC .......... H05K 2201/09281; H05K 2201/09427; H05K 2201/09854; H05K 2201/0969; H05K 2201/10037; H05K 2201/10272; H05K 2201/1034; H05K 2201/10924; H05K 2201/10984; H05K 2201/09381; H05K 2201/09463; H05K 2201/09472; H05K 2201/09745; H05K 2201/10257; H05K 2201/1031; H05K 2201/1028; H05K 2201/099; H05K 2201/09663; H05K 2201/037; H05K 2201/09; H05K 2201/096; H05K 3/3426; H01M 50/20; H01M 50/50; H01M 50/249; H01M 50/284; H01M 50/503; H01M 50/543; H01R 12/771

See application file for complete search history.

(56) References Cited

U.S. PATENT DOCUMENTS

| | | |
|---|---|---|
| 2012/0019061 A1 | 1/2012 | Nishihara et al. |
| 2013/0000957 A1 | 1/2013 | Ikeda et al. |
| 2018/0088179 A1 | 3/2018 | Ota et al. |
| 2018/0219204 A1 | 8/2018 | Takase et al. |
| 2020/0022260 A1* | 1/2020 | Takamatsu .......... H01M 50/519 |
| 2022/0077536 A1* | 3/2022 | Yamada .............. H01M 50/519 |

FOREIGN PATENT DOCUMENTS

| | | |
|---|---|---|
| JP | 2011-228217 A | 11/2011 |
| JP | 2018-55843 A | 4/2018 |
| WO | 2010/113455 A1 | 10/2010 |
| WO | 2017/018213 A1 | 2/2017 |

OTHER PUBLICATIONS

International Preliminary Report on Patentability issued in International Patent Application No. PCT/JP2020/033710, dated May 3, 2022, English translation.

* cited by examiner

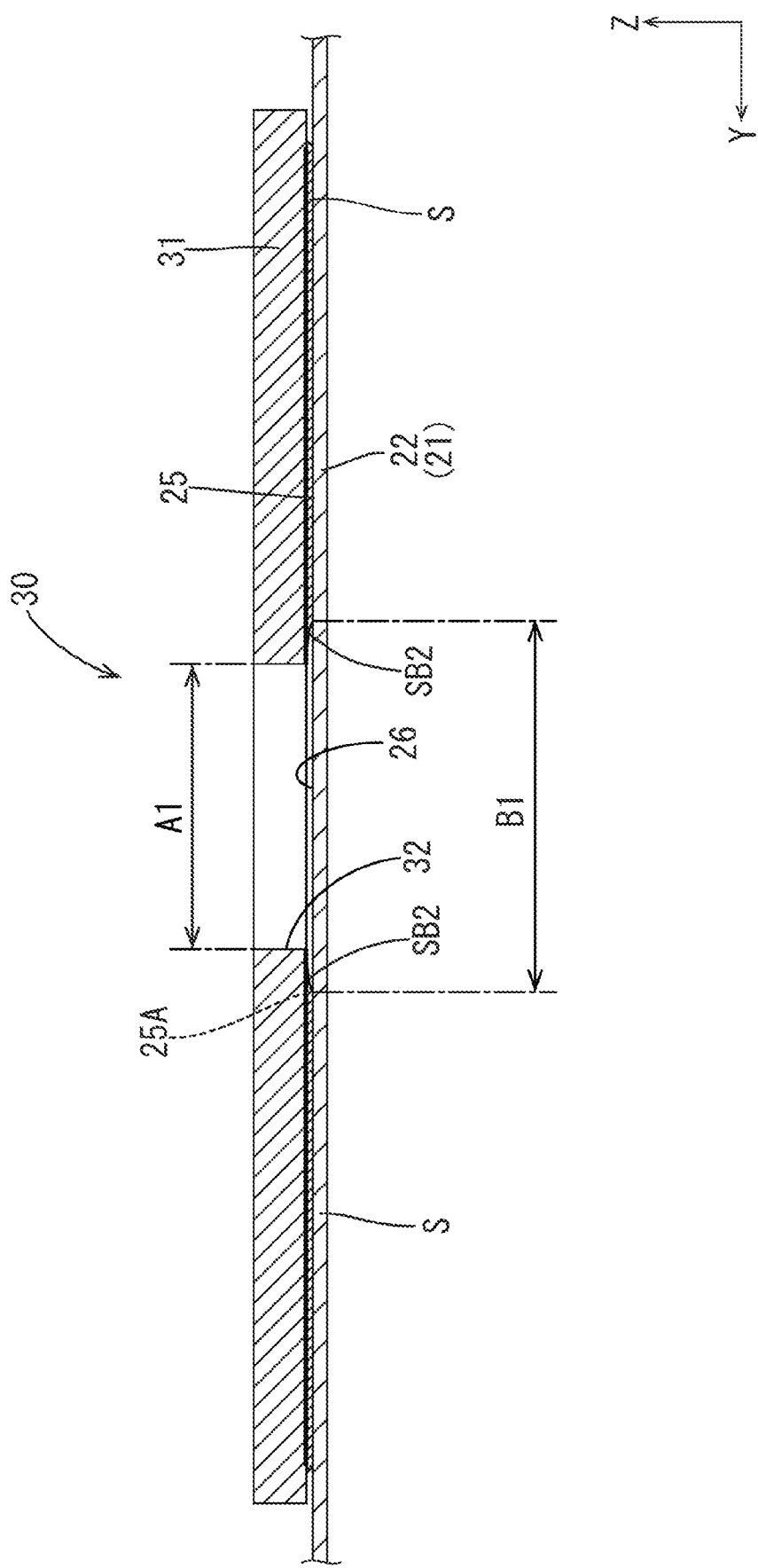

FLEXIBLE PRINTED CIRCUIT BOARD INCLUDING TERMINAL, WIRING MODULE, AND POWER STORAGE MODULE

TECHNICAL FIELD

The technology disclosed herein relates to a flexible printed circuit board including a terminal, a wiring module, and a power storage module.

BACKGROUND ART

A battery module disclosed in WO/2010-113455 (Patent Document 1) has been known. In the battery module, the coupling bus bar that is connected to the terminals of the adjacent battery cells includes a linking portion having a tongue shape. The linking portion is disposed on the contact pad on the flexible printed circuit board and the linking portion and the contact pad are connected with reflow soldering.

PRIOR ART DOCUMENT

Patent Document

Patent Document 1: WO 2010-113455

SUMMARY OF THE INVENTION

Problem to be Solved by the Invention

In the configuration in which the linking portion of the tongue shape is connected to the contact pad with reflow soldering, the linking portion, which is disposed on the contact pad, may be moved during the reflow soldering and this may cause problems due to the position displacement of the linking portion.

The technology described herein was made in view of the above circumstances. An object is to provide a flexible printed circuit board including a terminal and a power storage module that are less likely to cause problems by position displacement of the terminal.

Means for Solving the Problem

A flexible printed circuit board including a terminal described herein includes a flexible printed circuit board that includes an electrically conductive line and the terminal soldered to the flexible printed circuit board. The flexible printed circuit board includes a land and a soldering restricting section. The land is electrically connected to the electrically conductive line and has a metal surface and is soldered to the terminal. The soldering restricting section has a non-metal surface and is not soldered to the terminal. The terminal includes an overlapping section and a protrusion section. The overlapping section overlaps the land and is soldered to the land and includes a removed section that is formed in such a manner that a portion is partially removed in a predefined area. The protruding section is continuous from the overlapping section and protrudes to an area that does not overlap the flexible printed circuit board. The soldering restricting section is in an area of the flexible printed circuit board that corresponds to the predefined area and does not overlap the overlapping section.

Effects of Invention

According to the technology described herein, problems are less likely to be caused by position displacement of a terminal that is to be soldered to a flexible printed circuit board.

BRIEF DESCRIPTION OF THE DRAWINGS

FIG. 14 is a cross-sectional view along line D-D in FIG. 13.

MODES FOR CARRYING OUT THE INVENTION

Figure 1:
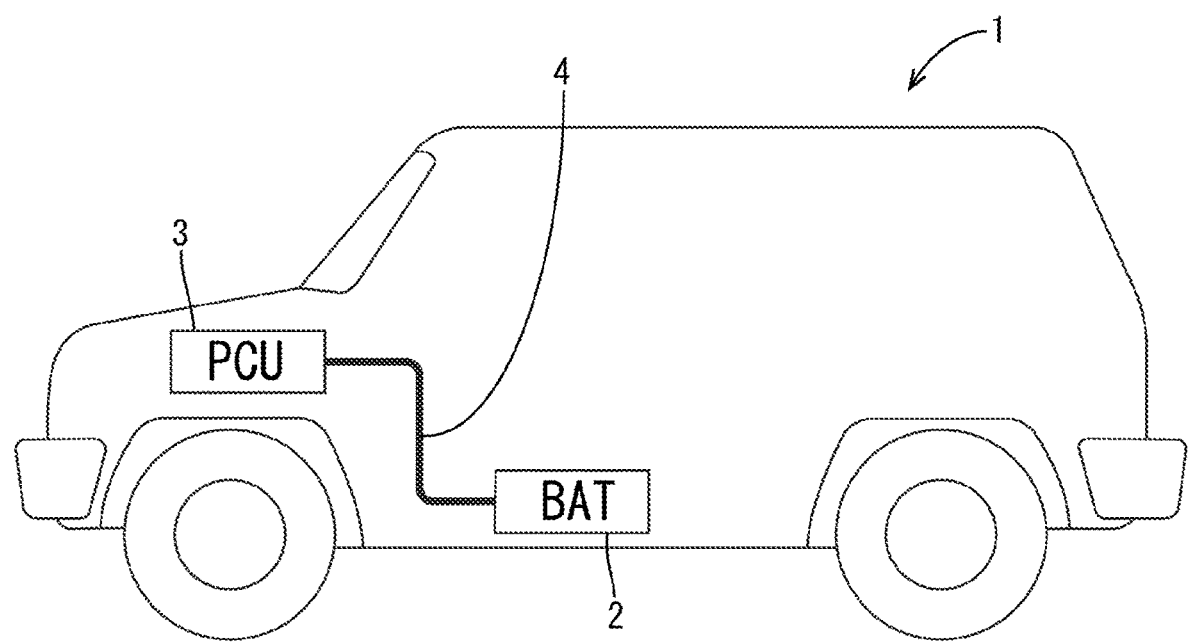
FIG. 1 is a schematic view illustrating a vehicle on which a power storage module according to a first embodiment is installed.

Description of Embodiments According to the Present Disclosure

First, embodiments according to the present disclosure will be listed and described.

(1) A flexible printed circuit board including a terminal described in this disclosure includes a flexible printed circuit board that includes an electrically conductive line and the terminal soldered to the flexible printed circuit board. The flexible printed circuit board includes a land and a soldering restricting section. The land is electrically connected to the electrically conductive line and has a metal surface and is soldered to the terminal. The soldering restricting section has a non-metal surface and is not soldered to the terminal. The terminal includes an overlapping section and a protrusion section. The overlapping section overlaps the land and is soldered to the land and includes a removed section that is formed in such a manner that a portion is partially removed in a predefined area. The protruding section is continuous from the overlapping section and protrudes to an area that does not overlap the flexible printed circuit board. The soldering restricting section is in an area of the flexible printed circuit board that corresponds to the predefined area and does not overlap the overlapping section.

According to such a configuration, the solder that is melted on the land during the reflow soldering is less likely to move due to the soldering restricting section having the non-metal surface and the removed section of the terminal. Therefore, the position displacement of each terminal that is caused by the movement of the solder is suppressed. Problems are less likely to be caused by the position displacement of the terminal.

(2) The removed section may be a through hole and the predefined area may be an inner area of the through hole.

According to such a configuration, the solder is less likely to move into the removed section.

(3) The through hole may have an elongated circular shape including a small diameter section and a large diameter section that is larger than the small diameter section. The soldering restricting section may be an elongated circular area that is along a hole edge of the through hole.

According to such a configuration, the displacement of the terminal in a direction in which the terminal rotates is suppressed due to the shapes of the removed section and the soldering restricting section.

(4) The flexible printed circuit board may extend to have a belt shape and the large diameter section of the through hole may extend along an extending direction in which the flexible printed circuit board extends.

According to such a configuration, the orientations of the removed section and the soldering restricting section that have an elongated circular shape suppress the position displacement of the terminal with respect to the extending direction in which the flexible printed circuit board extends, the direction crossing the extending direction, and the direction in which the terminal rotates (is tilted).

(5) The removed section may be a notch that is formed by cutting a portion of an edge of the overlapping section and the soldering restricting section may be provided along an edge of the notch.

According to such a configuration, the position displacement of the terminal is suppressed due to the shapes of the removed section and the soldering restricting section.

(6) The vehicular flexible printed circuit board including the terminal may be preferably to be installed in a vehicle.

(7) A wiring module described in this disclosure includes the flexible printed circuit board including the terminal, and an insulating protector holding the flexible printed circuit board.

(8) The wiring module may be preferably to be installed in a vehicle.

(9) A power storage module includes the flexible printed circuit board including the terminal, power storage elements including electrode portions that include positive electrode portions and negative electrode portions, and a connecting member connecting the electrode portions of the power storage elements that are adjacent to each other. the terminal is connected to the connecting member.

(10) The power storage module may be preferably to be installed in a vehicle.

Detail of Embodiments According to the Present Disclosure

Embodiments according to the present disclosure will be described. The present disclosure is not limited to the embodiments. All modifications within and equivalent to the technical scope of claims may be included in the technical scope of claims.

A first embodiment will be described with reference to FIGS. 1 to 7. In the first embodiment, the present disclosure is used in a power storage pack 2 to be installed in a vehicle 1. The power storage pack 2 is installed in the vehicle 1 such as an electric vehicle or a hybrid electric vehicle and used as a power source for the vehicle 1. In the following description, regarding components having the same configuration, some of the components may be indicated by reference signs and others may not be indicated by the reference signs.

Whole Configuration

As illustrated in FIG. 1, the power storage pack 2 is disposed in a middle section of the vehicle 1. A power control unit (PCU) 3 is disposed in a front section of the vehicle 1. The power storage pack 2 and the PCU 3 are connected to each other with a wire harness 4. The power storage pack 2 and the wire harness 4 are connected to each other with a connector, which is not illustrated. The power storage pack 2 includes a power storage module 10 including power storage elements 11.

(Power Storage Module 10)

Figure 2:
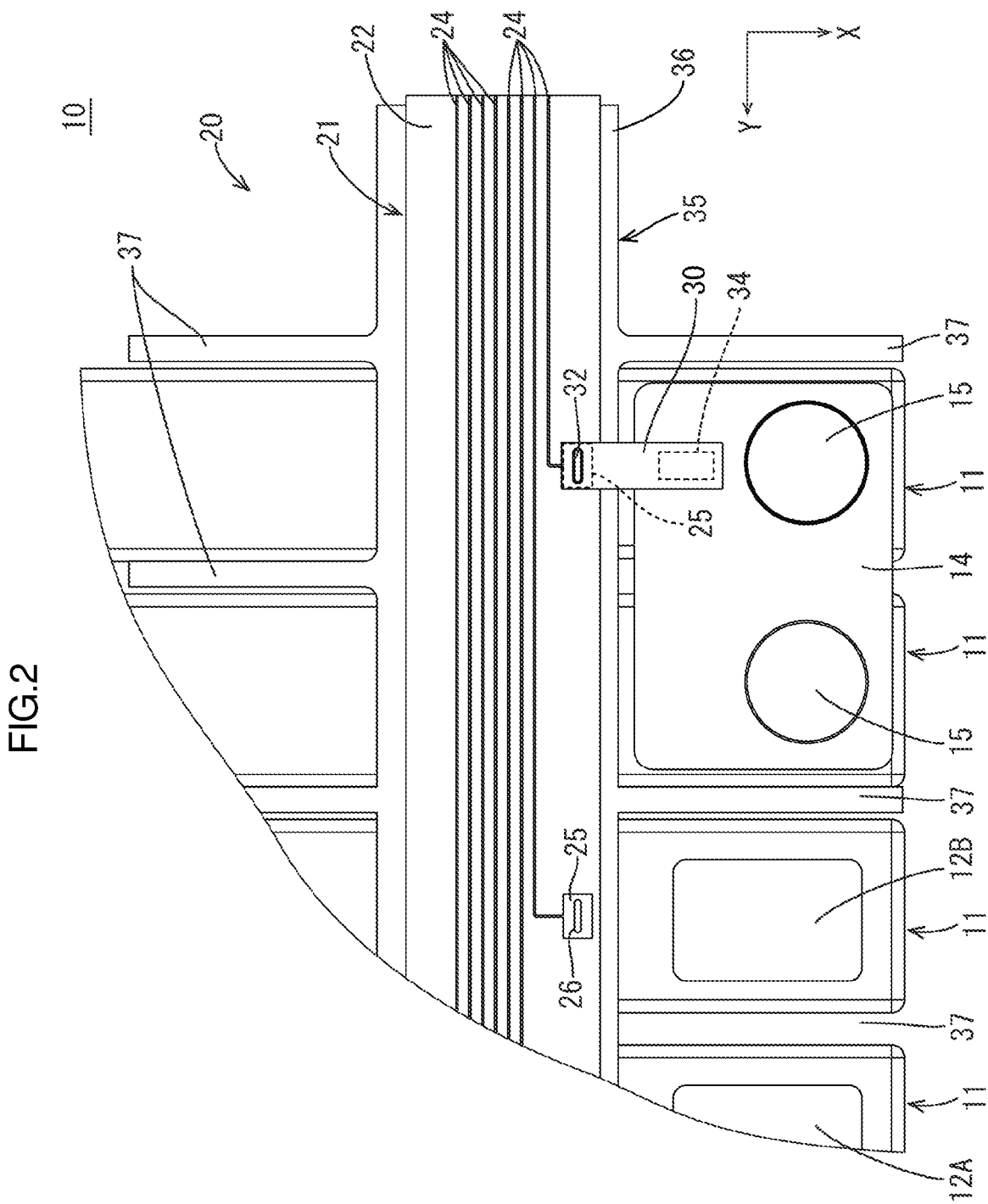
FIG. 2 is a plan view illustrating a portion of the power storage module according to the first embodiment.

As illustrated in FIG. 2 (FIG. 2 illustrates a portion of the power storage module 10 and other portion is not illustrated), the power storage module 10 includes multiple power storage elements 11, connecting members 14, and a wiring module 20. The power storage elements 11 are arranged in the right-left direction. The connecting member 14 connects electrode portions 12A and 12B of adjacent power storage elements 11. The wiring module 20 is attached to the power storage elements 11. In the following description, it is considered that an X direction, an Y direction, and a Z direction point the front side, the left side, and the upper side, respectively.

Each power storage element 11 has a rectangular flat box shape. The power storage elements 11 include electrode portions 12A, 12B (illustrated as positive electrode portions 12A, negative electrode portions 12B) that protrude from top surfaces. The power storage elements 11 may be secondary batteries such as lithium-ion secondary batteries or capacitors. Each of the electrode portions 12A, 12B has a top surface that is a flat rectangular shape and the connecting member 14 can be placed on the top surface. The adjacent power storage elements 11 are oriented such that polarities of the adjacent electrode portions 12A, 12B are opposite. The electrode 12A (12B) at an end of the series connection is connected to an external device such as an inverter via an electric line, which is not illustrated.

(Connecting Member 14)

Each connecting member 14 has a rectangular shape. The connecting member 14 is formed from a metal plate made of copper, copper alloy, aluminum, aluminum alloy, stainless steel (SUS), or other metal. The connecting member 14 has a sufficient size to cover two electrode portions 12A, 12B that are adjacent to each other. The connecting member 14 is fixed to the electrode portions 12A, 12B by laser-welding. Welding portions 15 are formed in the connecting member 14 after the laser-welding. Each welding portion 15 has a circular shape. In FIG. 2, one connecting member 14 is illustrated. With multiple connecting members 14, any number of the power storage elements 11 can be connected in series or in parallel.

(Wiring Module 20)

The wiring module 20 includes a flexible printed circuit board 21 (referred to as a FPC 21 in the following description), terminals 30, and an insulating protector 35 for holding the FPC 21. The FPC 21 and the connecting member 14 are electrically connected to each other via the terminal 30.

(FPC 21)

Figure 7:
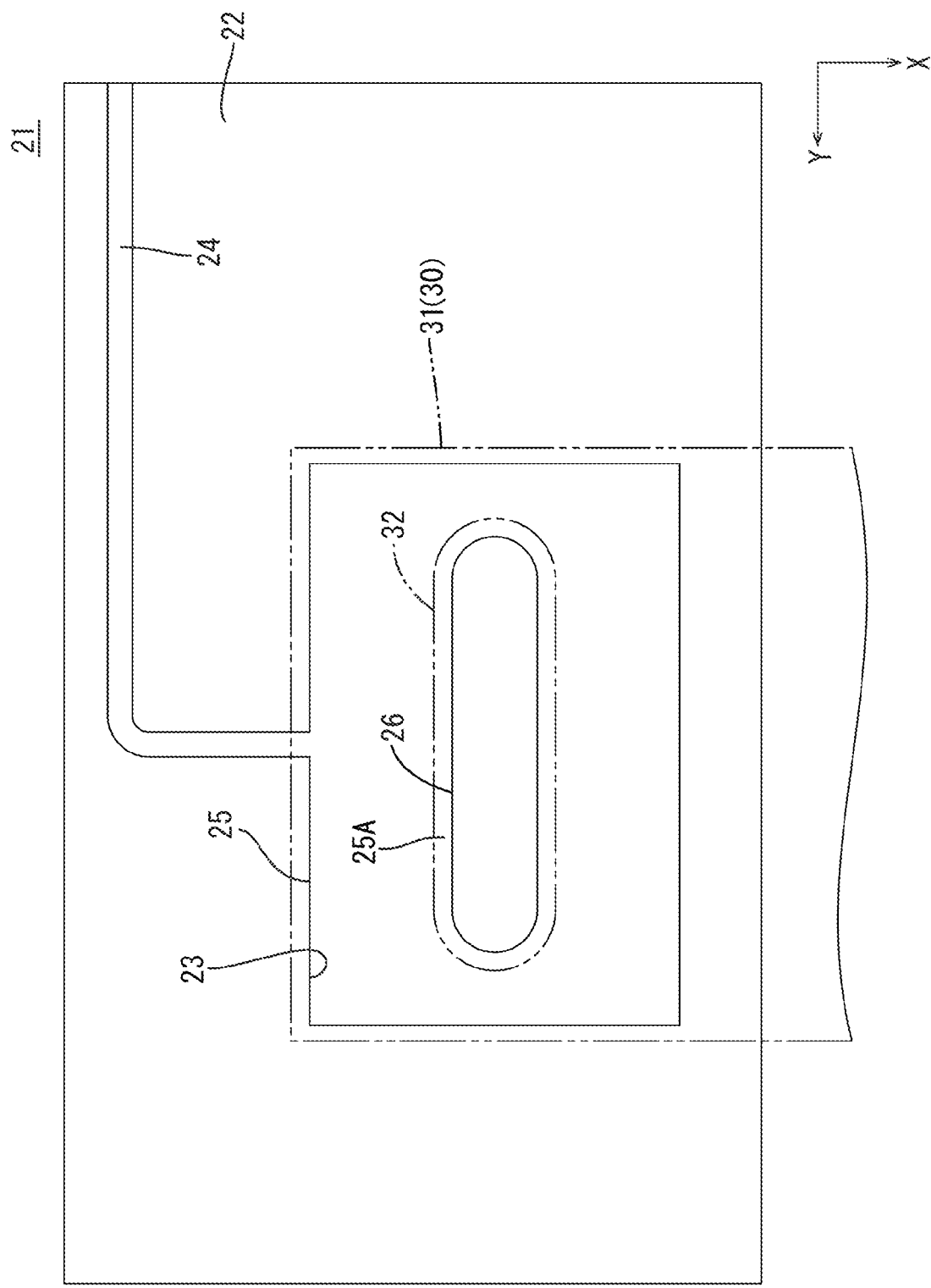
FIG. 7 is an enlarged plan view of the portion of the flexible printed circuit board.

The FPC 21 includes an insulating resin film 22 and electrically conductive lines 24. The electrically conductive lines 24 are made of metal such as a copper foil and are disposed on the insulating resin film 22. The insulating resin film 22 includes a base film and a cover film. The base film is made of synthetic resin having insulating properties such as polyimide having flexibility and insulating properties. The electrically conductive lines 24 are disposed on the base film. The cover film covers the electrically conductive lines that are arranged on the base film. The electrically conductive lines 24 are arranged at intervals with respect to the front-rear direction and extend in the right-left direction to the positions corresponding to the connecting members 14, respectively. A connecting member 14-side end of the electrically conductive line 24 is connected to a land 25 to which the terminal 30 can be soldered. As illustrated in FIG. 7, the land 25 is exposed through an opening 23 that is formed in the cover film by removing a section of the cover film. The lands 25 are made of metal such as copper foils and have a rectangular area. The lands 25 are disposed on the base film with adhesive.

A soldering restricting section 26 having a non-metal surface is inside an area of the land 25 (in a middle section of the land 25). No land 25 is provided in the soldering restricting section 26 and a cover film of the insulating resin film 22 is provided as the soldering restricting section 26. The soldering restricting section 26 does not necessarily have such a configuration but may have a following configuration. For example, a rectangular copper foil (a metal foil) is attached to the base film to form a land (without including the soldering restricting section) and a sheet having an elongated circular shape (the soldering restricting section) made of insulating synthetic resin may be attached to the land. In such a configuration, a mask used in the printing process for soldering may be used as the soldering restricting section, for example. A portion of the base film may be exposed without attaching a copper foil as the soldering restricting section. The soldering restricting section may be formed by forming a through hole in the insulating resin film 22.

An end of each electrically conductive line 24 on an opposite side from the land 25 is not illustrated; however, the end is electrically connected to an external electronic control unit. The electronic control unit includes a microcomputer and components. The electronic control unit has a known configuration to detect voltages, currents, and temperatures of the power storage elements 11 and to control charge and discharge of each power storage element 11.

(Terminal 30)

Figure 6:
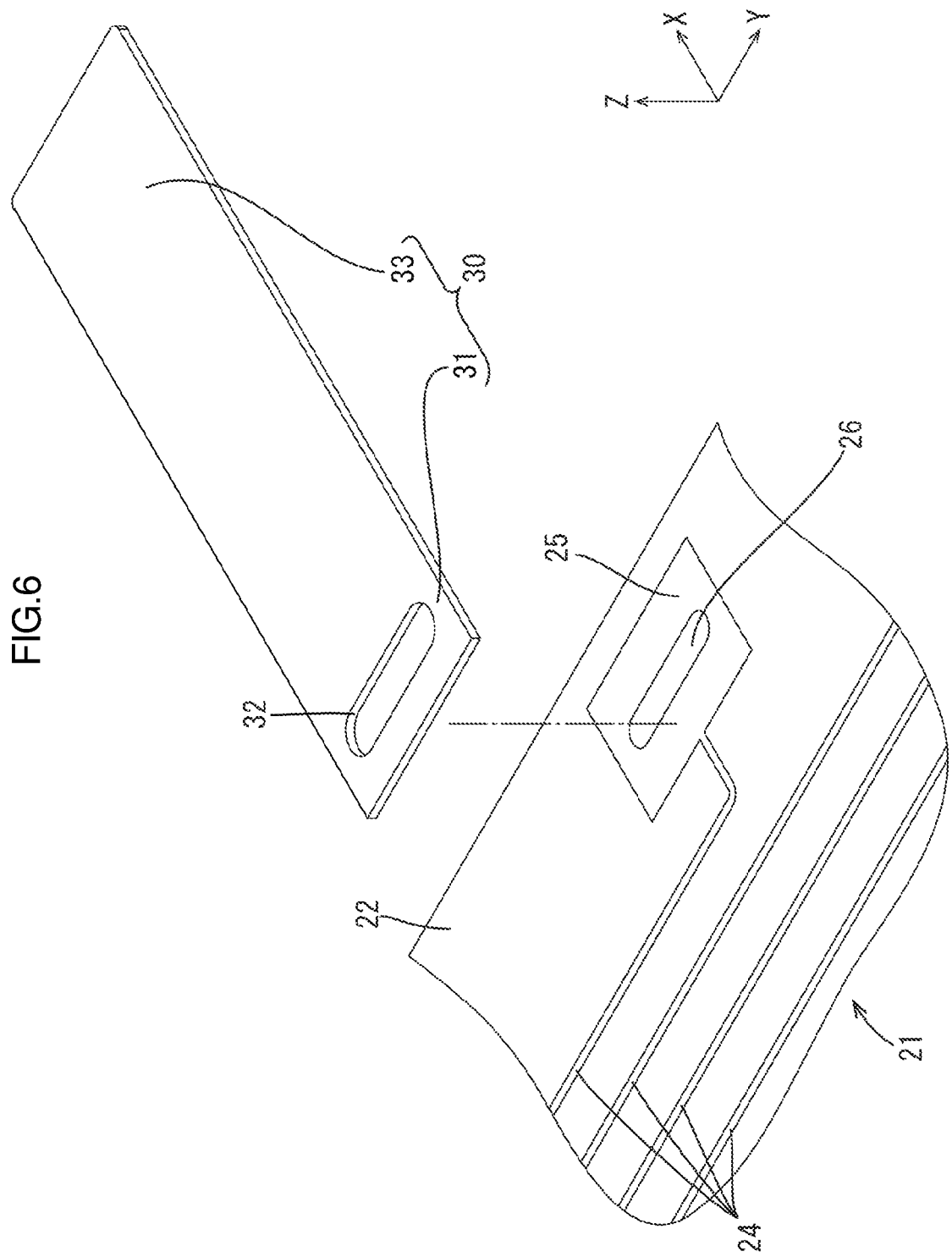
FIG. 6 is a perspective view illustrating the flexible printed circuit board and the terminal that is to be mounted on the flexible printed circuit board.

The terminals 30 are for detecting voltages of the connecting members 14 (and the electrode portions 12A, 12B). Each terminal 30 may be formed from a metal plate made of copper, copper alloy, aluminum, aluminum alloy, stainless steel (SUS), or other metal. The metal plate may be plated with nickel. As illustrated in FIG. 6, the terminal 30 has a long rectangular plate shape elongated in the front-rear direction. The terminal 30 includes an overlapping section 31 that overlaps the FPC 21 and a protruding section 33 that protrudes outward from the FPC 21 (outward from a side edge of the FPC 21 extending along the extending direction of the FPC 21). The protruding section 33 extends linearly in the front-rear direction and is welded to the connecting member 14.

Figure 3:
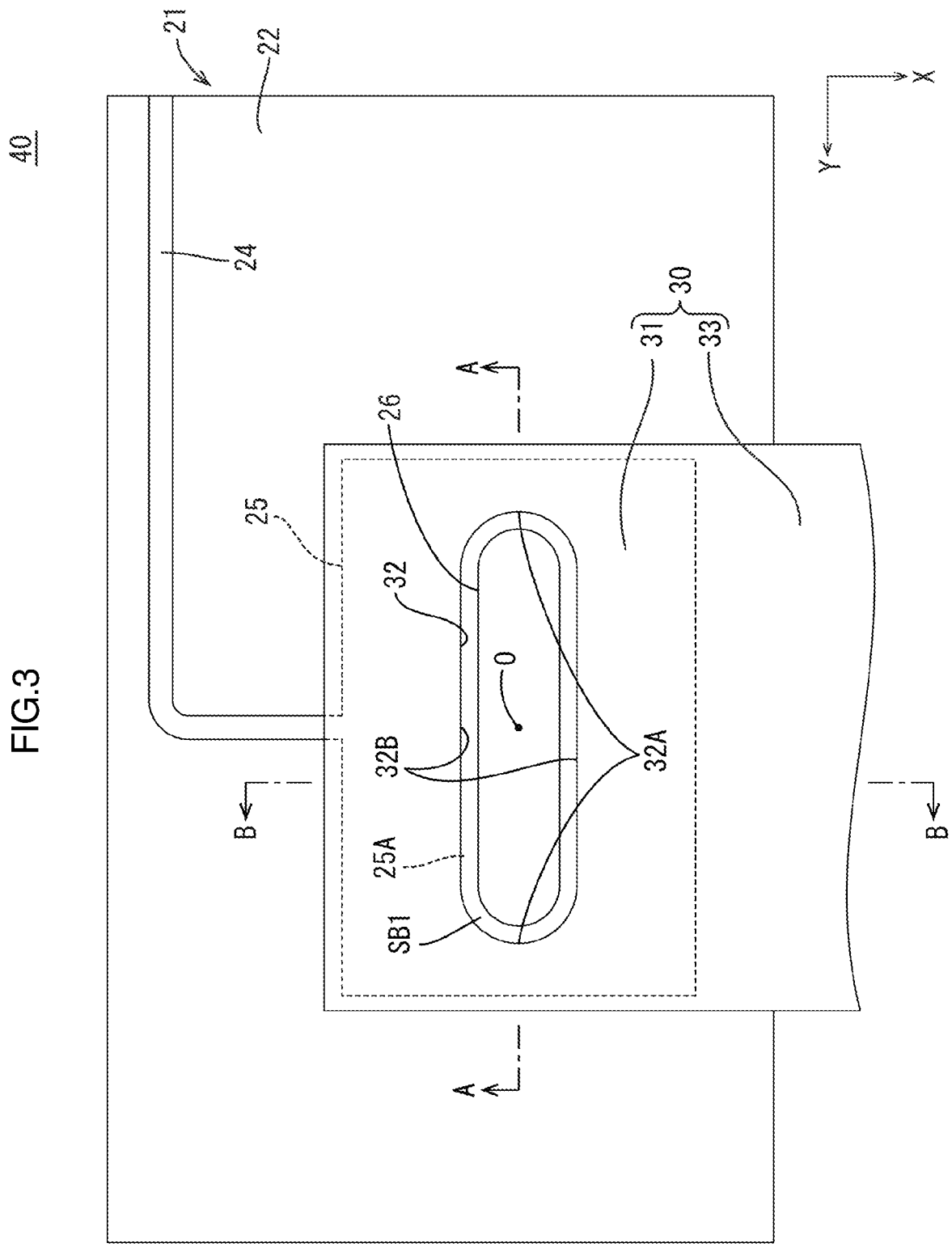
FIG. 3 is an enlarged plan view of a portion of a flexible printed circuit board including a terminal.
Figure 4:
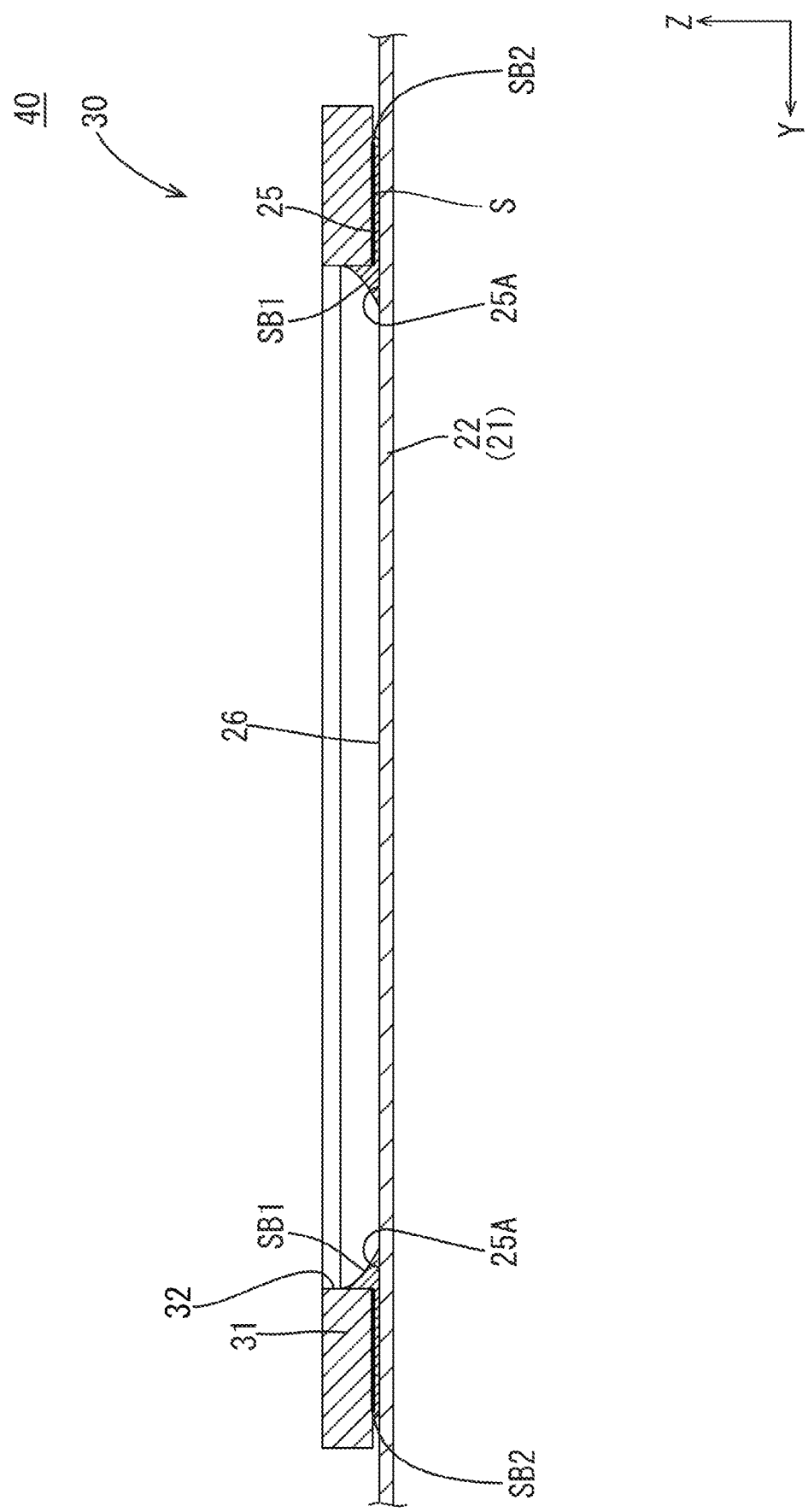
FIG. 4 is a cross-sectional view along line A-A in FIG. 3.
Figure 5:
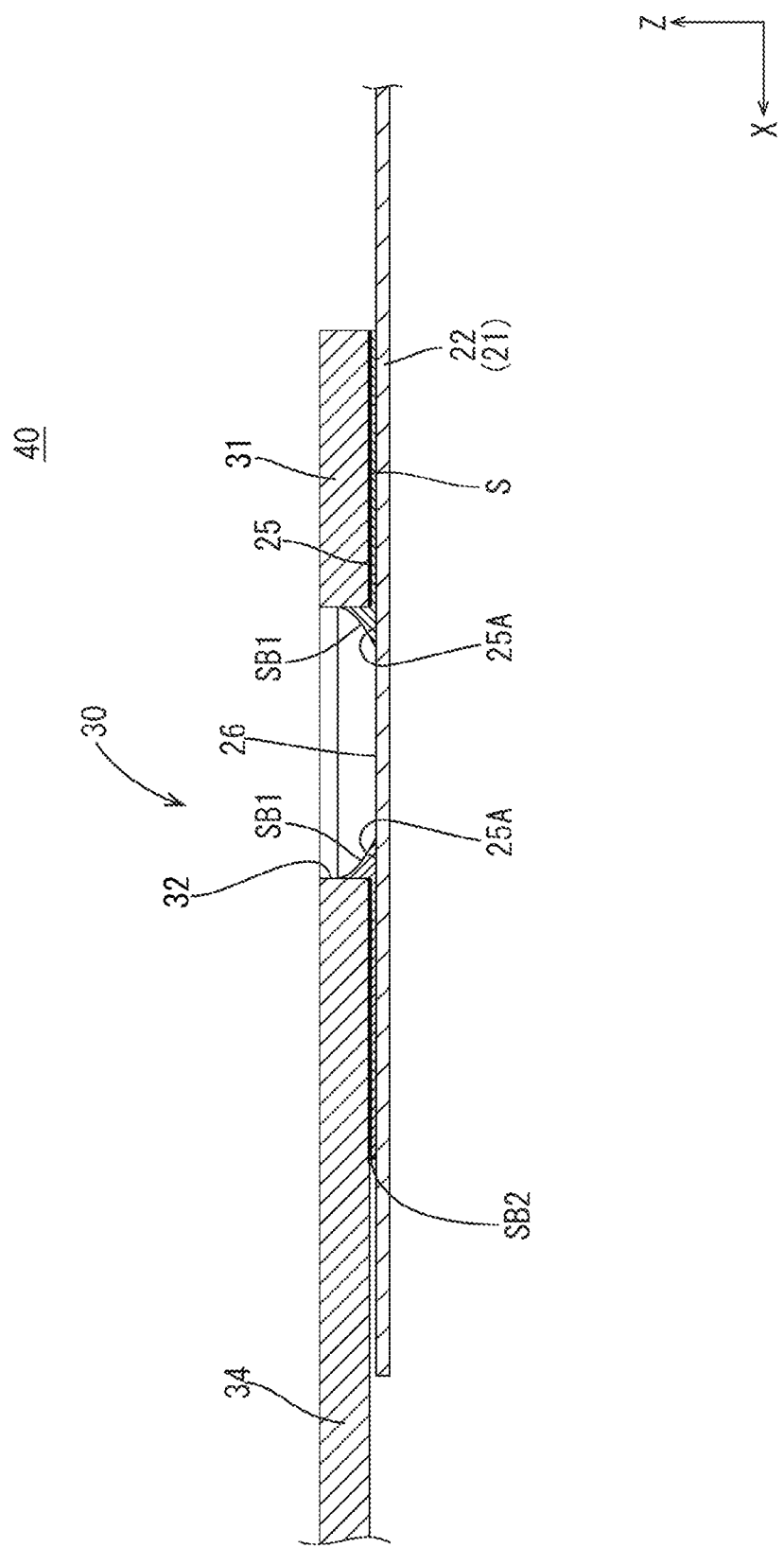
FIG. 5 is a cross-sectional view along line B-B in FIG. 3.

As illustrated in FIG. 3, the overlapping section 31 is disposed in an area that covers the land 25 entirely. A removed section 32 having an elongated circular shape is formed through the overlapping section 31. The removed section 32 includes a large diameter section 32A and a small diameter section 32B. The large diameter section 32A has a hole diameter (a diameter) extending in the Y-direction (a direction in which the FPC 21 extends). The small diameter section 32B has a hole diameter (a diameter) extending in the X-direction (a direction perpendicular to the direction in which the FPC 21 extends). The hole diameter of the small diameter section 32B is smaller than that of the large diameter section 32A. A center O of the removed section 32 is at a middle of the overlapping section 31. With the overlapping section 31 being disposed at a correct position on the land 25, the soldering restricting section 26 and an edge section 25A of the land 25 close to the soldering restricting section 26 are disposed in an area (a predefined area) inside a hole wall of the removed section 32 in the FPC 21, as illustrated in FIGS. 4 and 5.

With the overlapping section 31 being soldered to the land 25 with the solder S, a solder fillet SB1 is formed at a portion of the solder S adhering to the hole edge wall of the removed section 32. A solder fillet SB2 is formed at an outer edge of the solder S that is sandwiched between the overlapping section 31 and the land 25. The solder fillet SB2 spreads in an opposite direction from a direction in which the solder fillet SB1 spreads. The solder S may be lead-free solder including tin, silver, copper. The terminal 30 may be formed by punching a metal plate with a presser or cutting an outline of the plate with laser.

As illustrated in FIG. 2, the insulating protector 35 includes an arrangement portion 36 and walls 37. The FPC 21 is arranged on the arrangement portion 36. The walls 37 are plate members and insulate the adjacent power storage elements 11 from each other. The arrangement portion 36 is a flat plate member that extends in the right-left direction and the FPC 21 is fixed to a top surface of the arrangement portion 36 with adhesive.

Next, assembling of the power storage module 10 will be described.

As illustrated in FIG. 6, the lands 25 on the FPC 21 are coated with cream solder, for example, and the terminals 30 are disposed on the lands 25 (and the cream solder), respectively. Then, the FPC including the terminals 30 thereon is reflowed in a reflow furnace and the cream solder is heated and melted. Thus, the reflow soldering is performed. Because the solder S that is melted on the land 25 does not move to the soldering restricting section 26 having the non-metal surface, the position displacement of each terminal 30 is suppressed. With the solder S that is melted with reflow soldering being solidified, the terminals 30 are fixed to the FPC 21 with soldering. Thus, a flexible printed circuit board 40 including the terminal (FIG. 3) is obtained.

Next, a back surface of the FPC 21 is bonded and fixed to the top surface of the arrangement portion 36 of the insulating protector 35 with adhesive. Thus, the wiring module 20 is obtained (refer to FIG. 2). The connecting members 14 are disposed on the electrode portions 12A, 12B of the respective power storage elements 11 and the wiring module 20 is disposed on the power storage elements 11.

Next, the connecting members 14 are fixed to the electrode portions 12A, 12B with laser welding and the protruding sections 33 of the terminals 30 are fixed to the connecting members 14 with laser welding. Thus, welding portions 15, 34 are formed on the connecting members 14 and the terminals 30, respectively, and the power storage module 10 (FIG. 2) is obtained.

According to this embodiment, following operations and advantageous effects are obtained.

The flexible printed circuit board 40 including a terminal includes the FPC 21 (the flexible printed circuit board) and the terminals 30 that are soldered to the FPC 21. The FPC 21 includes the electrically conductive lines 24. The FPC 21 includes the lands 25 and the soldering restricting sections 26. The lands 25 are connected to the electrically conductive lines 24. The lands 25 have metal surfaces and are soldered to the terminals 30. The soldering restricting sections 26 have non-metal surfaces and are not soldered to the terminals 30. The terminals 30 include the overlapping sections 31 and the protruding sections 33. The overlapping sections 31 overlap the lands 25 and are soldered to the lands 25, respectively. The protruding sections 33 are continuous from the overlapping sections 31 and protrude to an area that does not overlap the FPC 21. The overlapping sections 31 include the removed sections 32 that are formed in such a manner that portions are partially removed from the overlapping sections 31 in predefined areas. The soldering restricting sections 26 are in areas of the FPC 21 that correspond to the predefined areas and do not overlap the overlapping sections 31.

According to this embodiment, the solder S that is melted on the land 25 during the reflow soldering is less likely to move due to the soldering restricting section 26 having the non-metal surface and the removed section 32 of the terminal 30. Therefore, the position displacement of each terminal 30 that is caused by the movement of the solder S is suppressed. Problems are less likely to be caused by the position displacement of the terminal 30.

The removed sections 32 are through holes and the predefined areas are inner areas of the through holes.

According to such a configuration, with the soldering restricting sections 26, the solder S is less likely to move into the removed sections 32.

The removed section 32 is a hole having an elongated circular shape and includes the small diameter section 32B and the large diameter section 32A that is greater than the small diameter section 32B. The soldering restricting section 26 is an elongated circular area having an outline extending along a hole edge of the removed section 32.

According to such a configuration, the displacement of the terminal 30 in a direction in which the terminal 30 rotates is suppressed due to the shapes of the removed section 32 and the soldering restricting section 26.

The FPC 21 has a shape extending to have a belt shape and the large diameter section 32A of the removed section 32 extends along the extending direction in which the FPC 21 extends.

According to such a configuration, the orientations of the removed section 32 and the soldering restricting section 26 that have an elongated circular shape suppress the position displacement of the terminal 30 with respect to the extending direction in which the FPC 21 extends, the direction crossing the extending direction, and the direction in which the terminal rotates (is tilted).

The flexible printed circuit board 40 including the terminal, the wiring module 20, and the power storage module 10 according to the present embodiment are to be installed in the vehicle 1.

For example, in the process of reflow soldering, if the positions of the terminals and the FPC are displaced from each other, the solder that is solidified after being melted may include a portion having smaller strength than other portions. If vibration is applied from the vehicle to the portion having smaller strength, problems may be caused in the solder. In this embodiment, since the position displacement between the FPC 21 and the terminals 30 is less likely to be caused, the solder S that is solidified after being melted is less likely to include the portion having relatively small strength. Thus, this embodiment is particularly effective for the flexible printed circuit board 40 including a terminal, the wiring module 20, and the power storage module 10 to be installed in the vehicle 1.

Embodiment 2

Figure 8:
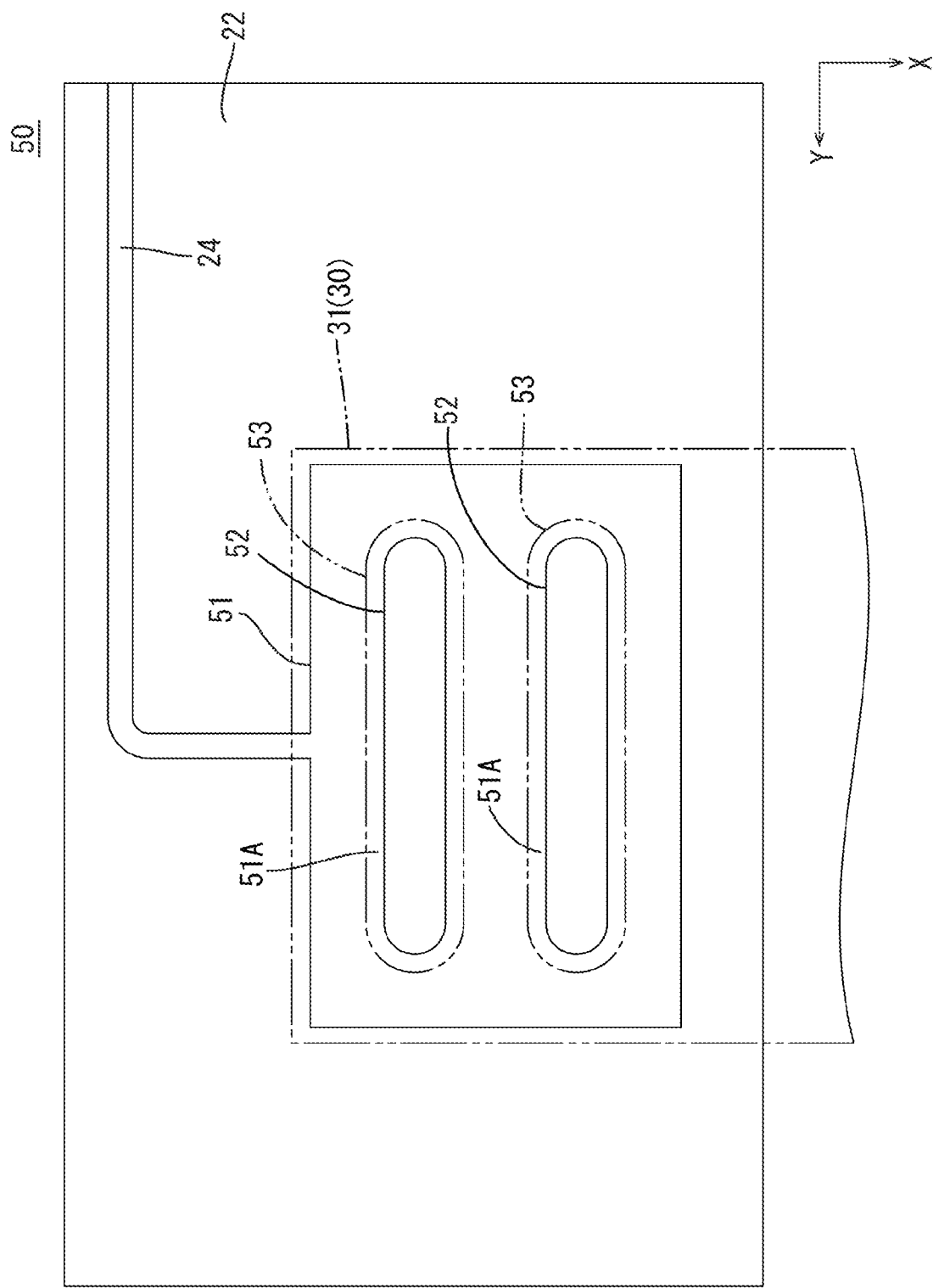
FIG. 8 is an enlarged plan view of a portion of a flexible printed circuit board according to a second embodiment.

Next, Embodiment 2 will be described with reference to FIG. 8. The FPC 21 of Embodiment 1 includes one soldering restricting section 26 for one land. However, a FPC 50 includes two soldering restricting sections 52, 52 in a land 51 in Embodiment 2. In the following description, components of this embodiment similar to those of the first embodiment will be indicated reference signs the same as the reference signs indicating the components in Embodiment 1 and will not be described.

The two soldering restricting sections 52 having non-metal surfaces are arranged in a direction perpendicular to (crossing) an extending direction in which the FPC 50 extends. No land 51 is provided in the soldering restricting sections 52 and a cover film of the insulating resin film 22 is provided as the soldering restricting sections 52. Two removed sections 53 having an elongated circular shape are formed through the overlapping section 31 of the terminal 30. The removed sections 53 have an elongated circular shape that extends along the Y-direction (the extending direction in which the FPC 50 extends). With the overlapping section 31 being disposed at a correct position on the land 51, the soldering restricting sections 52 and edge sections 51A of the lands 51 close to the soldering restricting sections 52 are disposed in an area inside hole walls of the removed sections 53.

Embodiment 3

Figure 9:
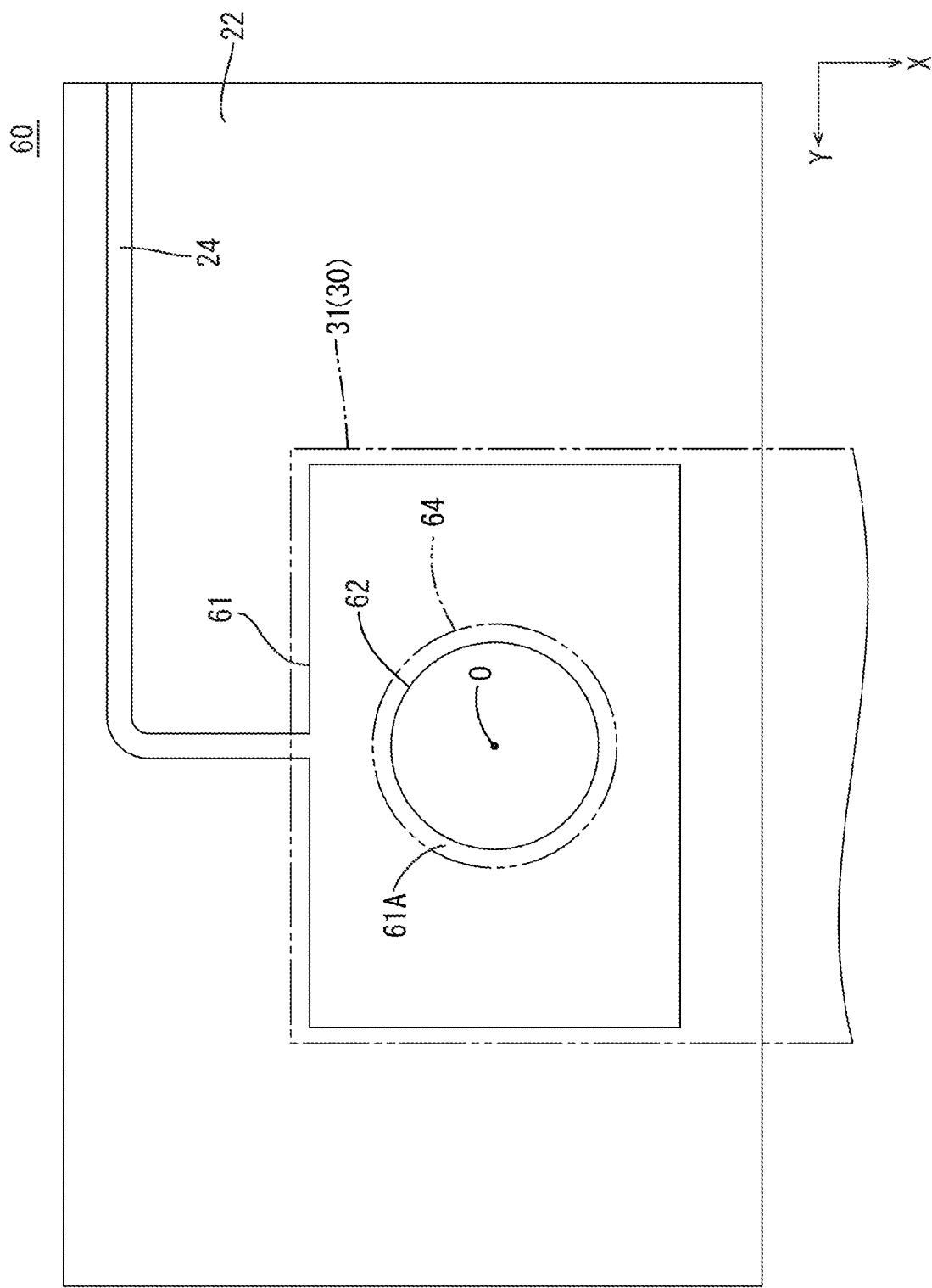
FIG. 9 is an enlarged plan view of a portion of a flexible printed circuit board according to a third embodiment.

Next, Embodiment 3 will be described with reference to FIG. 9. A FPC 60 of Embodiment 3 includes a soldering restricting section 62 having a circular shape in a land 61. In the following description, components of this embodiment similar to those of the above embodiments will be indicated reference signs the same as the reference signs indicating the components in the above embodiments and will not be described.

The soldering restricting section 62 having a non-metal surface is in the land 61 having a rectangular shape. The soldering restricting section 62 has a shape of a perfect circle. The overlapping section 31 of the terminal 30 includes a removed section 64 of a perfect circle. A center O of the removed section 64 is at a middle of the soldering restricting section 62. With the overlapping section 31 being disposed at a correct position on the land 61, the soldering restricting section 62 and an edge section 61A of the land 61 close to the soldering restricting section 62 are disposed in an area inside a hole wall of the removed section 64.

Embodiment 4

Next, Embodiment 4 will be described with reference to FIGS. 10 and 11. A terminal 76 of a flexible printed circuit board 79 including a terminal of Embodiment 4 does not include a through hole in an overlapping section 77 but includes removed sections 78 (one example of the removed section). Portions of side edges of the overlapping section 77 are cut to have notches as the removed sections 78. In the following description, components of this embodiment similar to those of the above embodiments will be indicated reference signs the same as the reference signs indicating the components in the above embodiments and will not be described.

Figure 10:
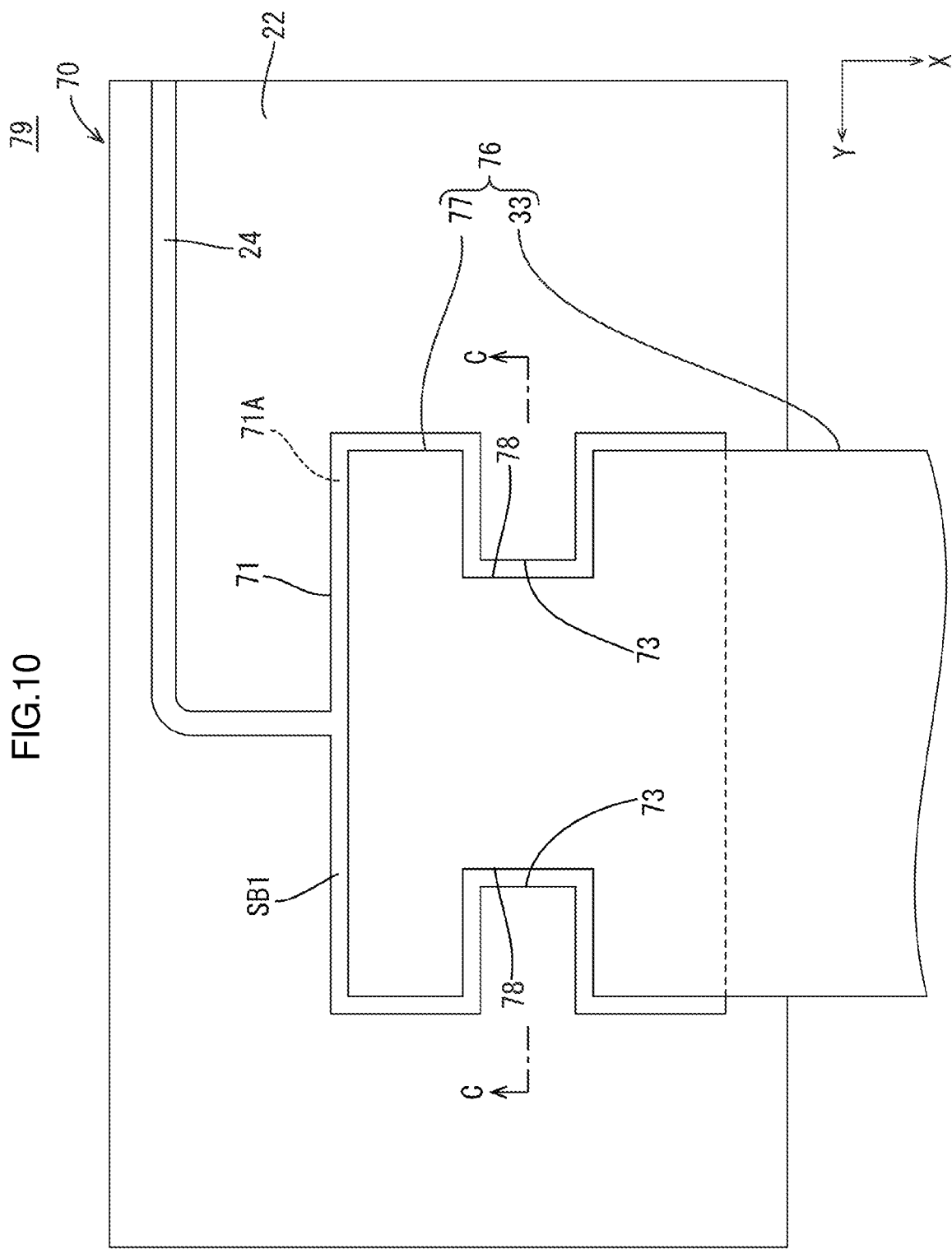
FIG. 10 is an enlarged plan view of a portion of a flexible printed circuit board including a terminal according to a fourth embodiment.
Figure 11:
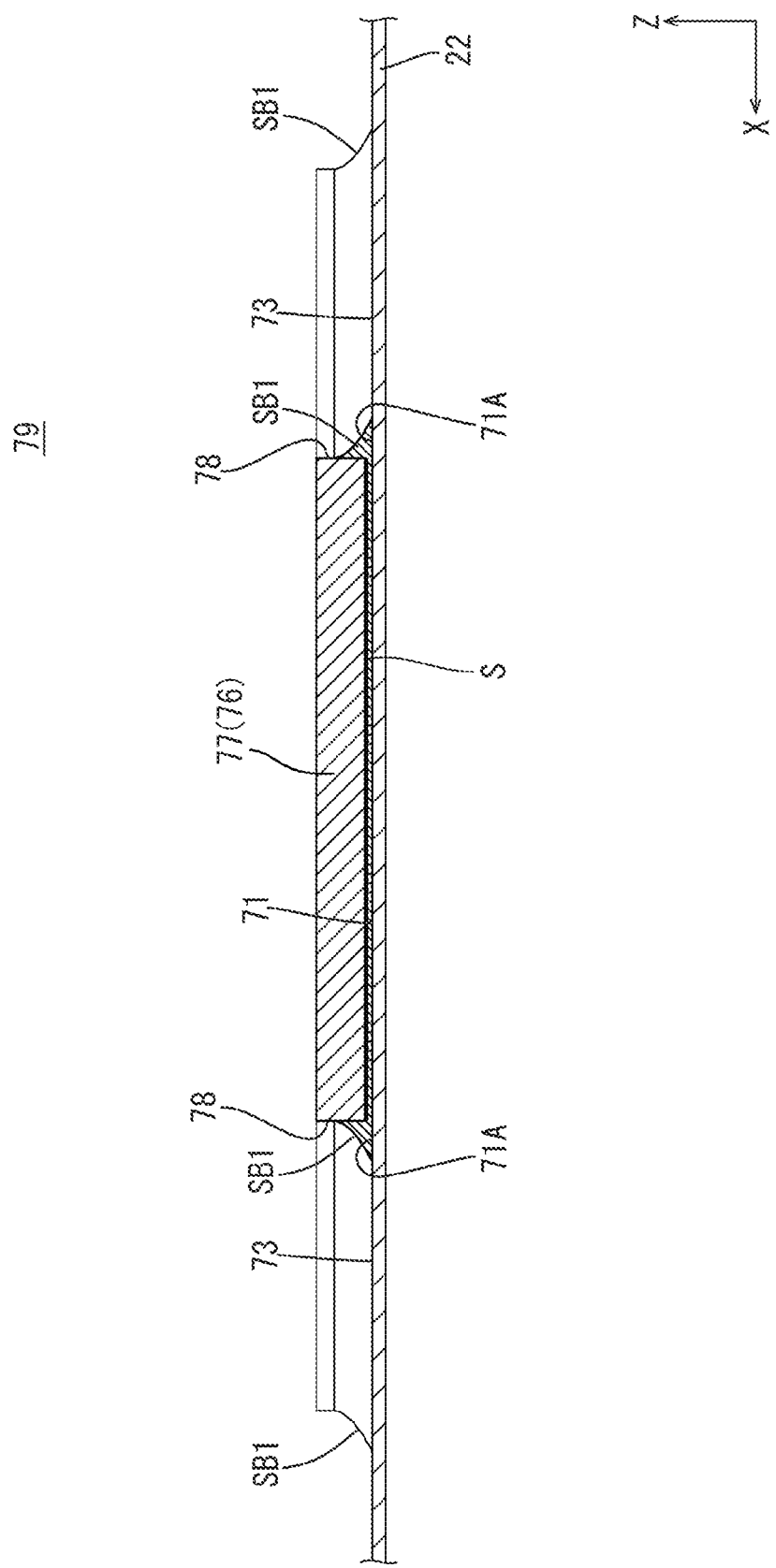
FIG. 11 is a cross-sectional view along line C-C in FIG. 10.

As illustrated in FIGS. 10 and 11, the land 71 on the FPC 70 is provided in an H-shaped area on the base film and soldering restricting sections 73 are provided in recessed portions of the right and left side edges of the land 71. The soldering restricting sections 73 are portions of (the cover film of) the insulating resin film 22 that project toward the land 71 to have a rectangular shape. The soldering restricting section 73 does not necessarily have such a configuration but may have a following configuration. For example, a rectangular copper foil (a metal foil) is attached to the base film to form a land (without including the soldering restricting sections 73) and a mask having an elongated circular shape made of insulating synthetic resin may be attached to the land in the printing process of soldering. The mask may be used as the soldering restricting sections, for example.

The overlapping section 77 of the terminal 76 includes a pair of removed sections 78 at the right and left side edges. Portions of the right and left side edges of the overlapping section 77 are cut to have notches as the removed sections 78. The overlapping section 77 overlaps the land 71 and an edge 71A of the land 71 is outside the overlapping section 77. As illustrated in FIG. 11, with the overlapping section 77 being soldered to the land 71, solder fillets SB1 are formed at the solder S adhering to the side edges of the overlapping section 77.

According to Embodiment 4, portions of the edges of the overlapping section 77 are cut to have notches as the removed sections 78. The soldering restricting sections 73 are provided along the edges of the removed sections 78.

According to such a configuration, the position displacement of the terminal 76 is suppressed due to the shapes of the removed sections 78 and the soldering restricting sections 73.

Other Embodiments

The technology disclosed herein is not limited to the embodiments described above and illustrated in the drawings. For example, the following embodiments will be included in the technical scope of the technology described in the present disclosure.

Figure 12:
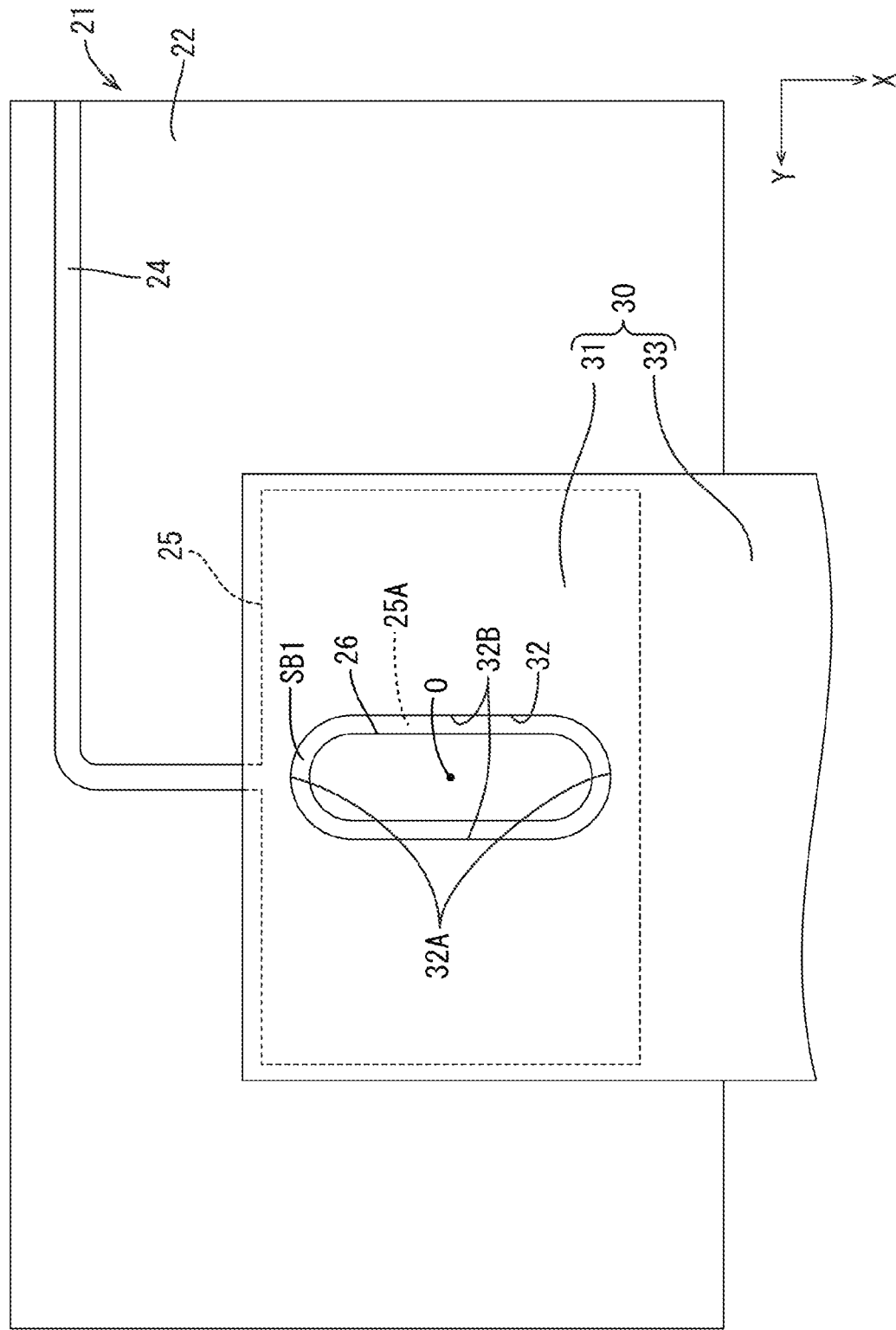
FIG. 12 is an enlarged plan view of a portion of a flexible printed circuit board including a terminal according to another embodiment.

(1) The shapes of the removed section 32 and the soldering restricting section 26 are not limited to the shapes of the above embodiments but may be altered to various shapes. For example, the removed section 32 and the soldering restricting section 26 may have a rectangular shape or an L-shape. As illustrated in FIG. 12, the removed section 32 of an elongated circular shape may include the large diameter section 32A that is elongated in a direction perpendicular to (crossing) the extending direction in which the FPC 21 extends.

(2) The protruding sections 33 of the terminals 30 extend in a form of flat plate but may have different shapes. For example, the protruding sections may have a bar shape. The protruding sections 33 are fixed to the connecting members 14 with laser welding but may be fixed to the connecting members 14 with welding other than laser welding, soldering, crimping, or pressing.

(3) The soldering restricting section 26, 52, 62, 73 may not be a film or a sheet but may be various kinds of members having non-metal surfaces. For example, the soldering restricting section may be formed by solidifying an adhesive.

Figure 13:
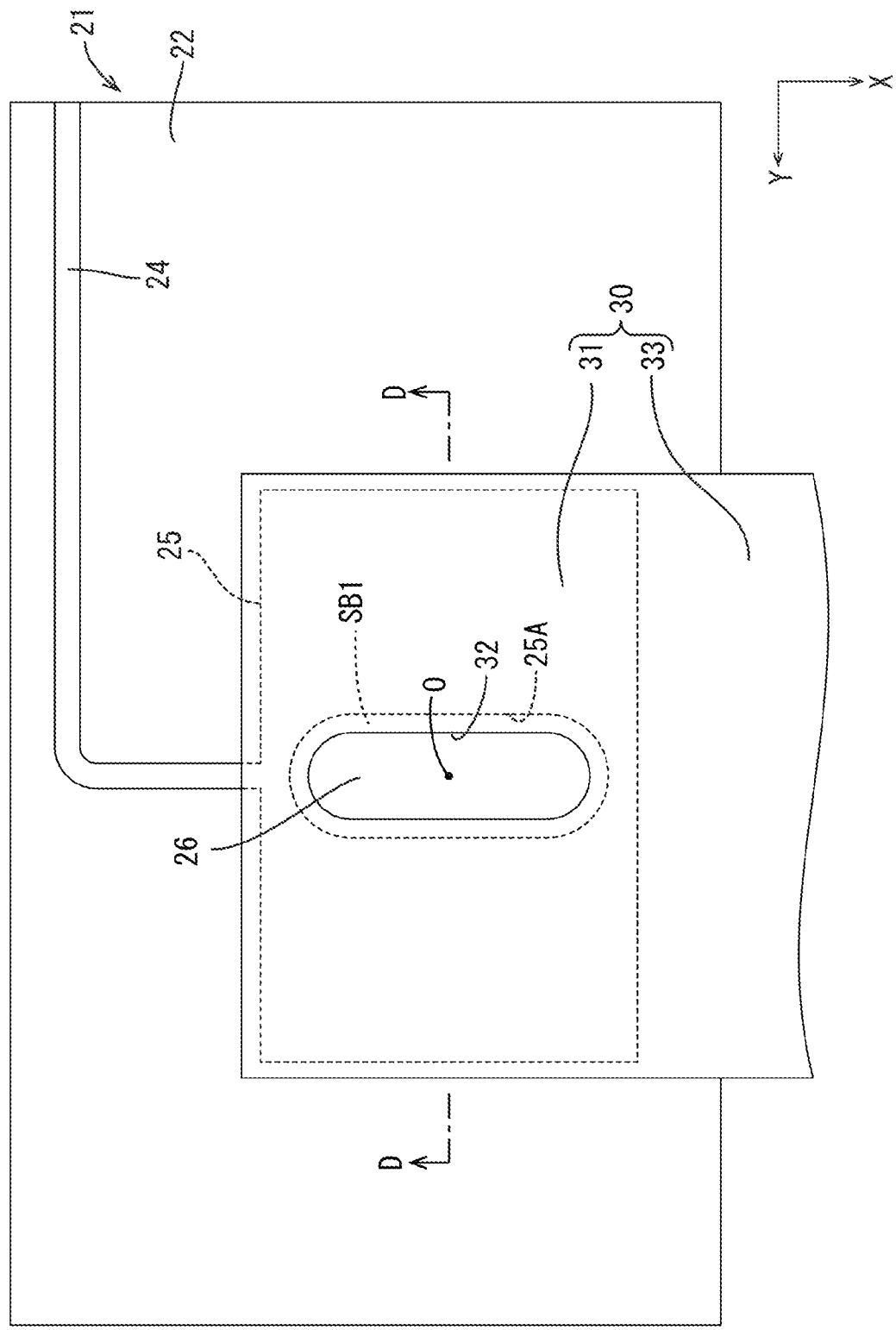
FIG. 13 is an enlarged plan view of a portion of a flexible printed circuit board including a terminal according to other embodiment.

(4) As illustrated in FIG. 13, the edge section 25A of the land 25 (close to the removed section 32) may be outside the removed section 32 of the elongated circular shape. In such a configuration, as illustrated in FIG. 14, the relation between a diameter A1 of the removed section 32 and a diameter B1 of the soldering restricting section is B1>A1. The solder S is entirely sandwiched between the overlapping section 31 and the land 25 and a solder fillet SB2 is formed at the outer edge of the solder S.

EXPLANATION OF SYMBOLS

1: Vehicle
2: Power storage pack
3: PCU
4: Wire harness
10: Power storage module
11: Power storage element
12A, 12B: Electrode portion
14: Connecting member
15, 34: Welding portion
20: Wiring module
21, 50, 60, 70: Flexible printed circuit board (FPC)
22: Insulation resin film
23: Opening
24: Electrically conductive line
25, 51, 61, 71: Land
25A, 51A, 61A, 71A: Edge section
26, 52, 62, 73: Soldering restricting section
30, 76, 77, 80: Terminal
31, 81: Overlapping section
32, 53, 64, 75, 78: Removed section
32A: Large diameter section
32B: Small diameter section
33: Protruding section
35: Insulating protector
36: Arrangement portion
37: Wall
40, 79: Flexible printed circuit board including a terminal
O: Center
S: Solder
SB1, SB2: solder fillet
A1: Diameter of removed section
B1: Diameter of soldering restricting section

The invention claimed is:
1. A power storage module, comprising:
a flexible printed circuit board including a terminal,
wherein the flexible printed circuit board further includes:
an electrically conductive line,
a land that is electrically connected to the electrically conductive line and has a metal surface and is soldered to the terminal, and
a soldering restricting section that has a non-metal surface and is not soldered to the terminal, wherein the terminal includes:
an overlapping section that overlaps the land and is soldered to the land and includes a removed section in a predefined area in the overlapping section, the removed section being formed in such a manner that a portion of the overlapping section is partially removed,
wherein the removed section is a through hole, and the predefined area is an inner area of the through hole,
wherein the through hole has an elongated circular shape including a small diameter section and a large diameter section that is larger than the small diameter section, and the soldering restricting section is an elongated circular area that is along a hole edge of the through hole, and
a protruding section that is continuous from the overlapping section and protrudes outside the overlapping section of the flexible printed circuit board, wherein
the soldering restricting section is in an area of the flexible printed circuit board that corresponds to the predefined area and does not overlap the overlapping section;
power storage elements including electrode portions that include positive electrode portions and negative electrode portions;
a connecting member connecting the electrode portions of the power storage elements that are adjacent to each other;
wherein the terminal is connected to the connecting member;
wherein the terminal connects the land of the flexible printed circuit board and the connecting member; and
wherein
the flexible printed circuit board extends to have a belt shape, and
the large diameter section of the through hole extends along an extending direction in which the flexible printed circuit board extends.

2. The power storage module according to claim 1, wherein
the removed section is a notch that is formed by cutting a portion of an edge of the overlapping section, and
the soldering restricting section is provided along an edge of the notch.

3. The power storage module according to claim 1, wherein the flexible printed circuit board is a vehicular flexible printed circuit board including the terminal and is configured to be installed in a vehicle.

4. The power storage module according to claim 1, comprising:
a wiring module including an insulating protector holding the flexible printed circuit board.

5. The power storage module according to claim 4, wherein the wiring module is configured to be installed in a vehicle.

6. The power storage module according to claim 1, wherein the power storage module is configured to be installed in a vehicle.

7. A power storage module, comprising:
a flexible printed circuit board including a terminal,
wherein the flexible printed circuit board further includes:
an electrically conductive line,
a land that is electrically connected to the electrically conductive line and has a metal surface and is soldered to the terminal, and
a soldering restricting section that has a non-metal surface and is not soldered to the terminal,
wherein the terminal includes:
an overlapping section that overlaps the land and is soldered to the land and includes a removed section in a predefined area in the overlapping section, the removed section being formed in such a manner that a portion of the overlapping section is partially removed, and
a protruding section that is continuous from the overlapping section and protrudes outside the overlapping section of the flexible printed circuit board, wherein
the soldering restricting section is in an area of the flexible printed circuit board that corresponds to the predefined area and does not overlap the overlapping section;
power storage elements including electrode portions that include positive electrode portions and negative electrode portions;
a connecting member connecting the electrode portions of the power storage elements that are adjacent to each other;
wherein the terminal is connected to the connecting member;
wherein the terminal connects the land of the flexible printed circuit board and the connecting member; and
wherein a planar surface of the protruding section of the terminal overlaps a planar surface of the connecting member.

* * * * *